US012720718B2

(12) United States Patent
Hosoi et al.

(10) Patent No.: US 12,720,718 B2
(45) Date of Patent: Aug. 25, 2026

(54) FEEDER MAGAZINE AND COMPONENT MOUNTING MACHINE

(71) Applicant: FUJI CORPORATION, Chiryu (JP)

(72) Inventors: Norio Hosoi, Chiryu (JP); Keita Tanaka, Takahama (JP)

(73) Assignee: FUJI CORPORATION, Chiryu (JP)

(*) Notice: Subject to any disclaimer, the term of this patent is extended or adjusted under 35 U.S.C. 154(b) by 483 days.

(21) Appl. No.: 18/558,921

(22) PCT Filed: Jun. 2, 2021

(86) PCT No.: PCT/JP2021/021024
§ 371 (c)(1),
(2) Date: Nov. 3, 2023

(87) PCT Pub. No.: WO2022/254615
PCT Pub. Date: Dec. 8, 2022

(65) Prior Publication Data

US 2024/0381601 A1 Nov. 14, 2024

(51) Int. Cl.
*H05K 13/00* (2006.01)
*H05K 13/04* (2006.01)

(52) U.S. Cl.
CPC ..... *H05K 13/0084* (2013.01); *H05K 13/0419* (2018.08)

(58) Field of Classification Search
CPC ........... H05K 13/0084; H05K 13/0419; H05K 13/021; H05K 13/0417
See application file for complete search history.

(56) References Cited

U.S. PATENT DOCUMENTS

| | | | | |
|---|---|---|---|---|
| 2,788,721 | A * | 4/1957 | Kniehahn | B41B 15/06 396/552 |
| 6,691,891 | B2 * | 2/2004 | Maldonado | G07F 11/42 211/59.3 |
| 7,703,614 | B2 * | 4/2010 | Schneider | A47F 1/126 211/59.3 |

(Continued)

FOREIGN PATENT DOCUMENTS

| | | |
|---|---|---|
| EP | 3 860 328 A1 | 8/2021 |
| JP | WO 2020/065754 A1 | 4/2020 |

OTHER PUBLICATIONS

International Search Report Issued Jul. 20, 2021, In PCT/JP2021/021024, filed on Jun. 2, 2021, therein, 2 pages.

*Primary Examiner* — Michael Collins
(74) *Attorney, Agent, or Firm* — Oblon, McClelland, Maier & Neustadt, L.L.P.

(57) ABSTRACT

A feeder magazine includes a ceiling portion, a bottom portion, and a back portion. Multiple support grooves are formed in the ceiling portion so as to extend in parallel to each other from an opening portion toward the back portion, and into which upper end portions of the feeders are detachably inserted. A flat surface is formed on the bottom portion so as to face the multiple support grooves of the ceiling portion, and multiple positioning portions that are disposed in the bottom portion respectively correspond to the multiple support grooves on an opening portion side of the flat surface and respectively engage with engaging portions formed on lower end portions of the feeders as the feeders are pushed from the opening portion toward the back portion.

8 Claims, 9 Drawing Sheets

(56) References Cited

U.S. PATENT DOCUMENTS

| | | | | |
|---|---|---|---|---|
| 8,464,900 | B2 * | 6/2013 | Simson | G07F 11/62<br>221/268 |
| 9,894,818 | B2 * | 2/2018 | Song | H05K 13/021 |

* cited by examiner 50
55
53a
143a
54
144
143b
53b
52a
145
150
140
125
57p
121
57
57t
122
120

50
55
53a
143a
54
144
143b
53b
52a
145
150
140
125
57p
121
57
57t
122
120
57p
121
125
57t
124
122

FEEDER MAGAZINE AND COMPONENT MOUNTING MACHINE

TECHNICAL FIELD

The present disclosure relates to a feeder magazine for accommodating multiple feeders each holding multiple components and a component mounting machine for collecting the components from the feeders and mounting the components on an object.

BACKGROUND ART

Conventionally, as a feeder for supplying a component to a component mounting machine, there is known a tape feeder including a thin box-shaped feeder main body and a tape reel around which a component supply tape holding multiple components is wound and which is detachably accommodated in the feeder main body (for example, refer to Patent Literature 1). On the upper end surface portion of the feeder main body of this tape feeder, a guide rail held by a slot groove formed in the upper portion of a feeder setting section of the component mounting machine, and a clamp device that clamps the feeder main body in an attached state with respect to the feeder setting section are provided. Further, a guide rail fitted in a rail groove formed in the lower portion of the feeder setting section is provided on the lower end surface portion of the feeder main body. In addition, two positioning pins for positioning the tape feeder with respect to a feeder accommodating space are provided in a portion higher than the center in the height direction of the end surface portion on the attachment direction side of the feeder main body.

PATENT LITERATURE

Patent Literature 1: International Publication No. WO 2020/065754

BRIEF SUMMARY

Technical Problem

In order to collectively convey and store multiple feeders, a feeder magazine that accommodates the multiple feeders may be used, or a structure corresponding to the feeder magazine may be incorporated in a mounting machine or the like. By providing grooves in both the ceiling portion and the bottom portion of the feeder magazine, the multiple feeders can be stably supported. However, in this case, it is not always easy to properly set the feeder with respect to the groove on the ceiling portion side and the groove on the bottom portion side corresponding thereto, and efficiency when accommodating the feeder in the feeder magazine deteriorates. Further, in a case where the lower end portion of the feeder is fitted into the groove on the bottom portion side not corresponding to the groove on the ceiling portion side, the feeder may be largely bent or may interfere with another feeder to be damaged.

Therefore, a main object of the present disclosure is to provide a feeder magazine and a component mounting machine capable of stably accommodating multiple feeders while favorably ensuring the efficiency when accommodating the feeders.

Solution to Problem

A feeder magazine of the present disclosure is a feeder magazine including a ceiling portion, a bottom portion, a back portion, and an opening portion on a side opposite to the back portion, the feeder magazine for accommodating multiple feeders each holding multiple components, the feeder magazine including multiple support grooves that are formed in the ceiling portion so as to open on a bottom portion side and extend in parallel to each other from the opening portion toward the back portion, respectively, and into which upper end portions of the feeders are detachably inserted, respectively, a flat surface that is formed on the bottom portion so as to face the multiple support grooves of the ceiling portion, and multiple positioning portions that are disposed in the bottom portion so as to respectively correspond to the multiple support grooves on an opening portion side of the flat surface and respectively engage with engaging portions formed on lower end portions of the feeders as the feeders are pushed from the opening portion toward the back portion in a state where the upper end portions are inserted into the support grooves.

When the feeder is accommodated in the feeder magazine of the present disclosure, the upper end portion of the feeder is inserted into the support groove which is a target of the ceiling portion, and the feeder is pushed toward the back portion from the opening portion. Then, as the feeder is pushed from the opening portion toward the back portion, the engaging portion of the feeder engages with the positioning portion on the opening portion side, and the accommodation of the feeder into the feeder magazine is completed. Accordingly, basically, when the feeder is supported by the support groove of the ceiling portion and pushed toward the back portion, the feeder can be accommodated into the feeder magazine. In addition, even if the engaging portion of the feeder is engaged with at least one of the positioning portions not corresponding to the support grooves supporting the upper end portion, the engaging portion of the feeder can be engaged with the positioning portion corresponding to the support groove supporting the upper end portion again without removing the entire feeder from the feeder magazine. Accordingly, the multiple feeders can be accommodated into the feeder magazine so as to extend straight in the vertical direction without being inclined. Further, since the foreign matter is less likely to stay on the flat surface of the bottom portion, it is possible to prevent the foreign matter from being engaged between the lower end portion of the feeder and the flat surface, and thus it is possible to favorably suppress inclination of the feeder due to engagement of the foreign matter, interference with other feeders, and the like. As a result, according to the feeder magazine of the present disclosure, it is possible to stably accommodate multiple feeders while favorably ensuring the efficiency when accommodating the feeders.

A component mounting machine of the present disclosure is a component mounting machine including a feeder mounting portion configured to accommodate multiple feeders each holding multiple components, the component mounting machine for collecting the components from the feeders and mounting the components on an object, in which the feeder mounting portion includes a ceiling portion, a bottom portion, a back portion, an opening portion on a side opposite to the back portion, multiple support grooves that are formed on the ceiling portion so as to open on a bottom portion side and extend in parallel to each other from the opening portion toward the back portion, respectively, and into which upper end portions of the feeders are detachably inserted, respectively, a flat surface that is formed on the bottom portion so as to face the multiple support grooves of the ceiling portion, and multiple positioning portions that are disposed in the bottom portion so as to respectively correspond to the multiple support grooves on an opening portion side of the flat surface and respectively engage with engaging portions formed on lower end portions of the feeders as the feeders are pushed from the opening portion toward the back portion in a state where the upper end portions are inserted into the support grooves.

DESCRIPTION OF EMBODIMENTS

Next, an embodiment for carrying out the present disclosure will be described with reference to the drawings.

Figure 1:
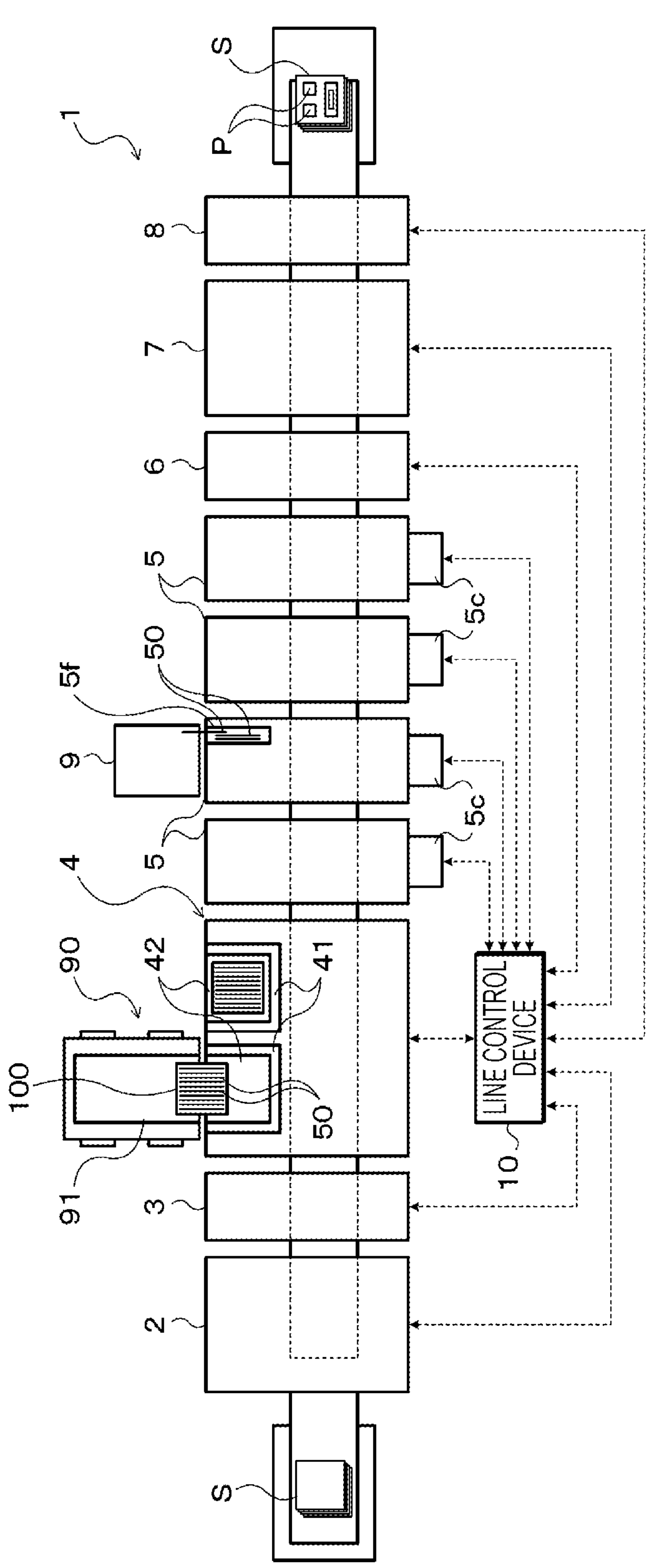
FIG. 1 is a schematic configuration view illustrating a production line using a feeder magazine of the present disclosure.

FIG. 1 is a schematic configuration view illustrating production line 1 using feeder magazine 100 of the present disclosure. Production line 1 shown in FIG. 1 produces board S on which component P is mounted, and includes printing device 2, print inspection device 3, storage section (buffer station) 4, multiple (for example, 4 in the present embodiment) component mounting machines 5, mounting inspection device 6, reflow device 7, reflow inspection device 8, line control device 10, and the like. Printing device 2, print inspection device 3, storage section 4, multiple component mounting machines 5, mounting inspection device 6, reflow device 7, and reflow inspection device 8 are arranged in this order along a predetermined conveyance direction of board S.

Printing device 2 is a device for printing solder on a wiring pattern of board S, and includes a board conveyance device for conveying board S, a printing head, a head movement device for moving the printing head, a fixed frame to which a screen mask is fixed, a control device that is a computer including CPU, ROM, RAM, a nonvolatile storage device, an input/output interface, and the like (none is shown). Print inspection device 3 is for inspecting the state of the solder printed on board S by printing device 2, and includes an inspection mechanism, a control device (computer) for controlling the inspection mechanism, and the like. The control devices of printing device 2 and print inspection device 3 mutually exchange information with line control device 10 via wireless or wired communication, respectively.

In the present embodiment, storage section 4 is incorporated between print inspection device 3 and most upstream component mounting machine 5 in production line 1, and includes multiple (2 in the present embodiment) storage spaces 41 and multiple (2 in the present embodiment) electric conveyors 42 installed in corresponding storage spaces 41 so as to deliver articles to and from electric conveyors 91 of automated guided vehicle (AGV) 90. Further, in the present embodiment, line control device 10 of production line 1 is installed in storage section 4, and controls a control target such as electric conveyer 42 of storage section 4. In storage section 4, multiple articles to be used for the production of board S on which component P is mounted are temporarily stored in order to improve the production efficiency in production line 1.

In the present embodiment, the articles stored in storage section 4 are feeders 50 to be mounted on each component mounting machine 5, and multiple feeders 50 scheduled to be mounted (before use) on component mounting machine 5 are stored in first storage space 41, and multiple used feeders 50 removed from component mounting machine 5 are stored in second storage space 41. In addition, in the present embodiment, in order to collectively deliver multiple feeders 50 between storage section 4 and automated guided vehicle 90, box-shaped feeder magazine 100 capable of accommodating multiple feeders 50 is used. Multiple feeders 50 accommodated in one feeder magazine 100 may accommodate components different from each other, or may accommodate the same components as each other.

Further, production line 1 includes loader 9. Loader 9 is caused by line control device 10 to move along the conveyance direction of board S and deliver feeder 50 between storage section 4 and multiple component mounting machines 5. That is, loader 9 collects multiple used feeders 50 from corresponding component mounting machine 5 and stores multiple used feeders 50 in feeder magazine 100 stored in second storage space 41 of storage section 4. In addition, loader 9 takes out multiple feeders 50 before use from first storage space 41 (feeder magazine 100) of storage section 4 and mounts feeders 50 on corresponding component mounting machines 5.

Each of multiple component mounting machines 5 is a surface mounting machine capable of collecting component P from a tape sent out by feeder 50 and mounting component P on board S as an object, and multiple component mounting machines 5 are arranged downstream of print inspection device 3 along the conveyance direction of board S as shown in FIG. 1. Each component mounting machine 5 includes a housing, a feeder setting base on which multiple feeders 50 are mounted, a board conveyance device, an XY movement device, a mounting head including at least one suction nozzle, a part camera, a mark camera, a nozzle station (none is shown), control device 5*c*, and the like. Control device 5*c* of each component mounting machine 5 is a computer including CPU, ROM, RAM, a nonvolatile storage device, an input/output interface, and the like, and mutually exchanges information with line control device 10 via wireless or wired communication.

In addition, control device 5*c* acquires imaging data of the part camera and the mark camera, detected values of various sensors (not shown) installed in the board conveyance device, the XY movement device, the mounting head, and the like. Further, control device 5*c* executes a production program based on information from line control device 10, imaging data of the part camera and the mark camera, detected values of various sensors, and the like to control multiple feeders 50 (component supply units), the board conveyance device, the XY movement device, the mounting head, and the like. The production program defines the mounting order of components P on board S in multiple component mounting machines 5 of production line 1, the number of boards S to be produced, and the like, and is stored in the ROM of control device 5*c* and the like.

Mounting inspection device 6 is for inspecting the mounting state of component P mounted by each component mounting machine 5, and includes an inspection mechanism, a control device (computer) for controlling the inspection mechanism, and the like. The control device of mounting inspection device 6 also mutually exchanges information with line control device 10 via wireless or wired communication. Reflow device 7 is disposed downstream of mounting inspection device 6, and includes a board conveyance device for conveying board S from mounting inspection device 6, a heating section for heating board S conveyed by the board conveyance device, and a control device for controlling the board conveyance device, the heating section, and the like. Reflow device 7 melts the solder on board S by heating board S to a predetermined reflow temperature (for example, 220° C. to 250° C.) with the heating section. As a result, the melted solder is cooled and solidified so that each component is electrically connected to and fixed to the wiring pattern of board S. Reflow inspection device 8 is for inspecting the state of component P on board S on which reflow processing is performed, and includes an inspection mechanism, a control device for controlling the inspection mechanism, and the like. The control devices of reflow device 7 and reflow inspection device 8 are computers including CPU, ROM, RAM, a storage device, and the like, and mutually exchange information with line control device 10 via wireless or wired communication, respectively.

Line control device 10 is a computer that includes CPU, ROM, RAM, a nonvolatile storage device such as a hard disk drive or a solid state drive, an input/output interface, and the like, and is connected to an input device such as a keyboard and a mouse, and a display device (none is shown). The storage device of line control device 10 stores various production information related to the production of board S. The production information includes an inventory state and a supply state of components P to be mounted on board S, a production plan of board S (including a plan of using components P), a production state of board S, operation states of multiple component mounting machines 5 constituting production line 1, and the like. Further, line control device 10 provides various command signals or the like to the print control section of printing device 2, control device 5*c* of each component mounting machine 5, the reflow control section of reflow device 7, and the like in response to a request or the like from the device side. Line control device 10 may include a server and a terminal connected to the server via a network.

Figure 2:
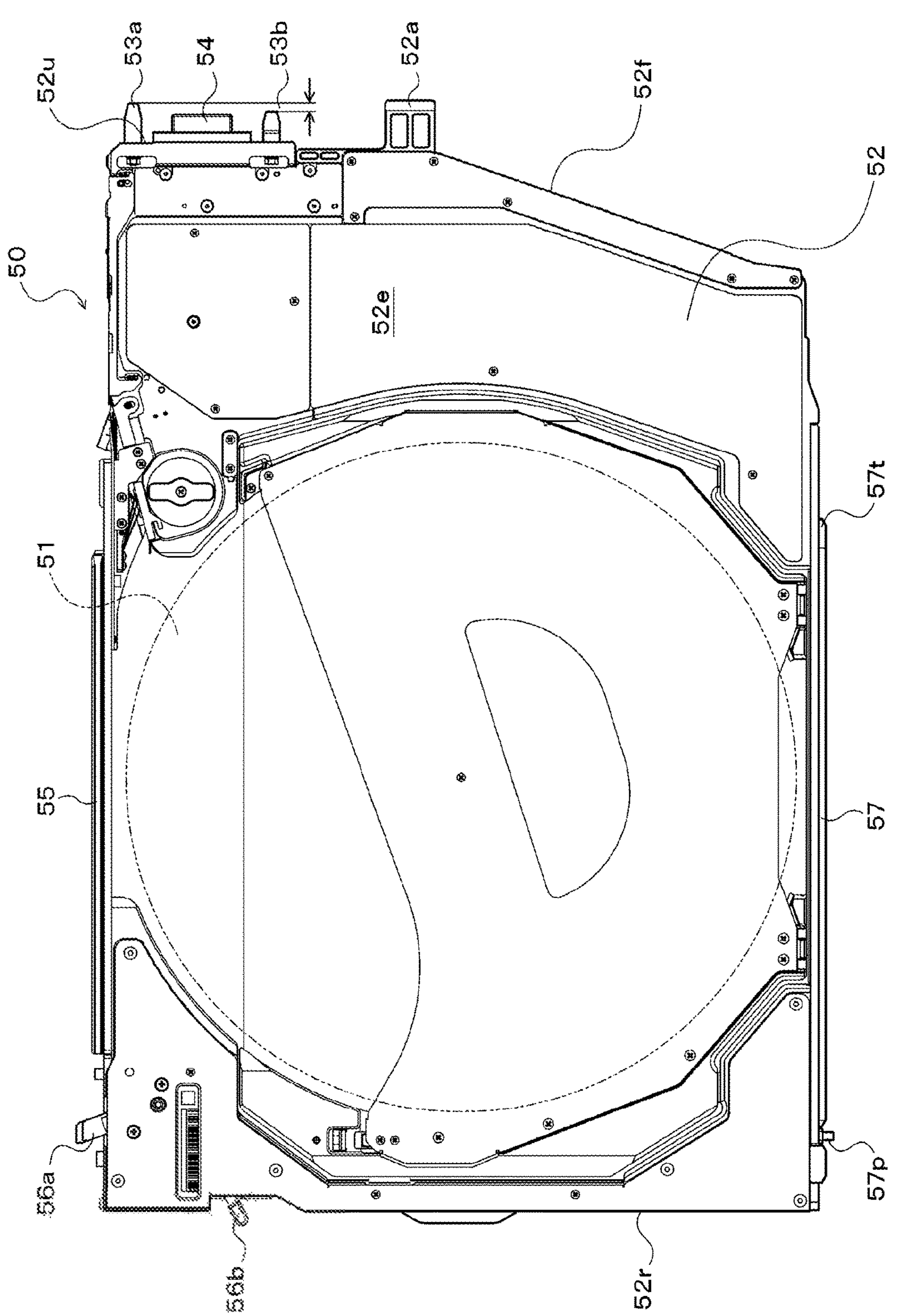
FIG. 2 is a schematic configuration view illustrating a feeder accommodated in the feeder magazine of the present disclosure.

Feeder 50 to be mounted on each component mounting machine 5 of production line 1 is a cassette type tape feeder, and as shown in FIG. 2, includes tape reel 51 around which a tape accommodating multiple components P is wound, and a thin box-shaped feeder main body 52 that detachably accommodates tape reel 51. In each tape reel 51, multiple components P are each protected by a film covering the surface of the tape, and the film is peeled off before component P reaches a component supply position in component mounting machine 5. Further, a tape feeding mechanism that pulls out the tape from tape reel 51 and feeds the tape to the component supply position and a feeder control device that controls the tape feeding mechanism are accommodated in feeder main body 52 (both are not shown). The feeder control device includes a microcomputer or the like having CPU, ROM, RAM, and the like. In the present embodiment, the electrical components such as the tape feeding mechanism and the feeder control device are accommodated in electrical component accommodating portion 52*e* defined between front end surface 52*f* located on the right side of feeder main body 52 in FIG. 2 and the accommodating portion of tape reel 51.

In addition, front end surface 52*f* of feeder main body 52 extends in the vertical direction perpendicular to the upper end surface of feeder main body 52 above the center in the height direction of feeder main body 52, and is inclined downward from the vicinity of the center so as to approach rear end surface 52*r* of feeder main body 52 located on the left side in FIG. 2. First positioning pin 53*a* and second positioning pin 53*b* are provided on upper portion 52*u* of front end surface 52*f* located above the center in the height direction of feeder main body 52. First positioning pin 53*a* protrudes rightward in FIG. 2 from upper portion 52*u* of front end surface 52*f* in the vicinity of the upper end surface of feeder main body 52, and second positioning pin 53*b* protrudes rightward in FIG. 2 from upper portion 52*u* of front end surface 52*f* below first positioning pin 53*a*. In the present embodiment, the distal end of lower second positioning pin 53*b* is located closer to rear end surface 52*r* side (the left side in FIG. 2) than the distal end of upper first positioning pin 53*a*.

Further, feeder connector 54 is provided on upper portion 52*u* of front end surface 52*f*. Feeder connector 54 protrudes rightward in FIG. 2 from between first positioning pin 53*a* and second positioning pin 53*b* arranged at intervals in the vertical direction. When feeder 50 is mounted on component mounting machine 5 and feeder connector 54 is coupled to a connector (not shown) provided in component mounting machine 5, power is supplied from component mounting machine 5 side to the electrical components such as the tape feeding mechanism and the feeder control device, and various information is exchanged between control device 5*c* of component mounting machine 5 (see FIG. 1) and the feeder control device. In addition, feeder main body 52 includes bumper 52*a* protruding rightward in FIG. 2 from between upper portion 52*u* of front end surface 52*f* and the lower inclined portion.

Relatively long guide rail 55 having a T-shaped cross section is fixed to the upper end surface of feeder main body 52. Guide rail 55 extends from the vicinity of the rear end of electrical component accommodating portion 52*e* of feeder main body 52 to a position before rear end surface 52*r*, and forms the upper end portion of feeder 50. Further, feeder main body 52 includes clamp member 56*a* for fixing feeder 50 to component mounting machine 5 or feeder magazine 100. Clamp member 56*a* is biased by a biasing member such as a spring (not shown) so as to protrude obliquely upward from the upper end surface of feeder main body 52 to rear end surface 52*r* side on rear end surface 52*r* side of guide rail 55, and engages with an engaged portion formed in component mounting machine 5 or feeder magazine 100. Further, by operating release lever 56*b* protruding from rear end surface 52*r* of feeder main body 52, clamp member 56*a* can be moved against the biasing force of the biasing member, and the engagement between clamp member 56*a* and the engaged portion can be released.

In addition, relatively long rail member 57 forming a lower end surface of feeder 50 is fixed to a lower end portion of feeder main body 52. Front end 57*t* of rail member 57 is located closer to rear end surface 52*r* side than first positioning pin 53*a* and second positioning pin 53*b*, and upper portion 52*u* of front end surface 52*f*, and rail member 57 extends from the vicinity of the rear end of electrical component accommodating portion 52*e* of feeder main body 52 to a position before rear end surface 52*r*. Further, at the lower end portion of feeder main body 52, protrusion 57*p* is formed which protrudes downward from the lower end surface of rail member 57 (feeder 50) on rear end surface 52*r* side of rail member 57.

Figure 3:
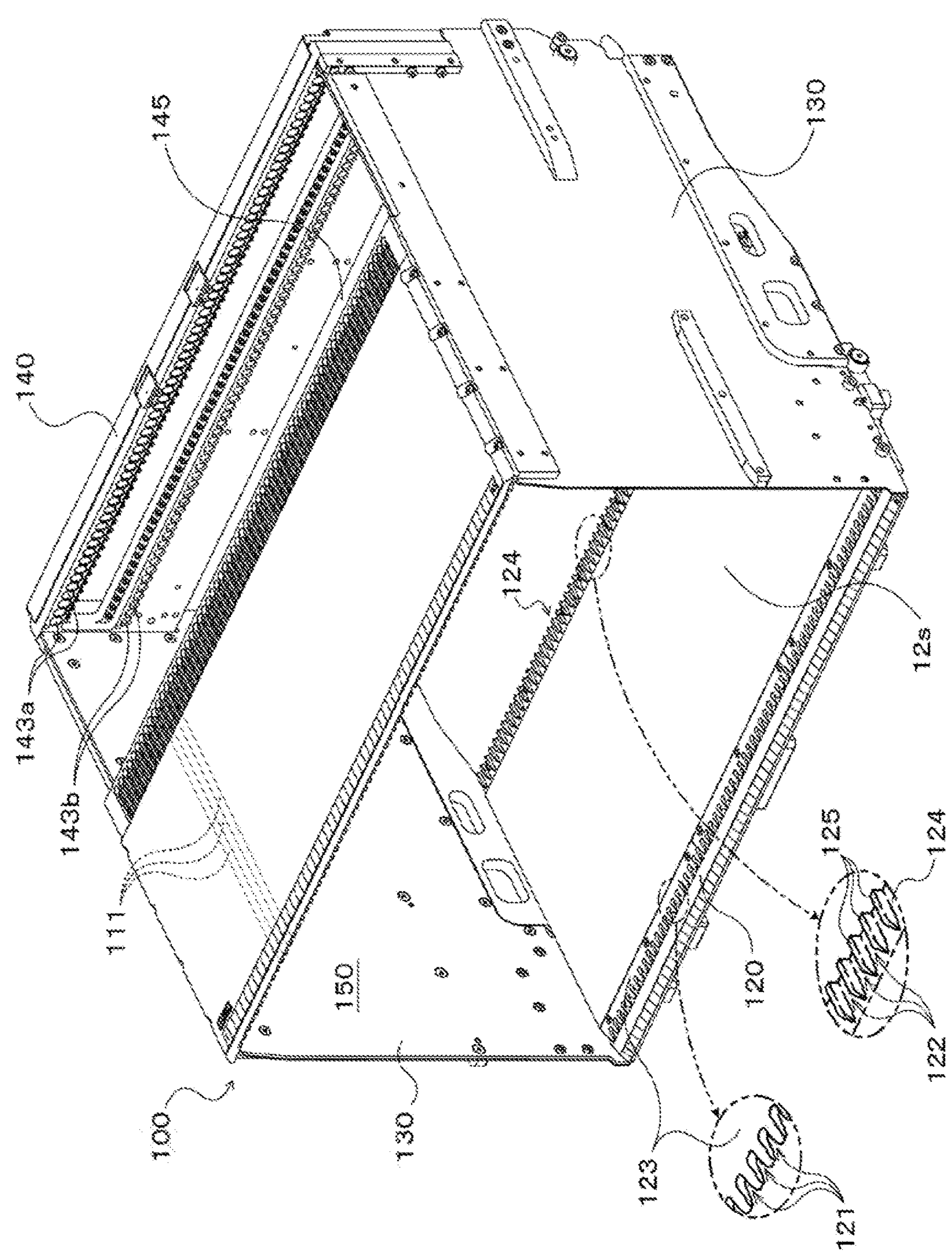
FIG. 3 is a perspective view illustrating the feeder magazine of the present disclosure.

FIG. 3 is a perspective view illustrating feeder magazine 100 of the present disclosure. As shown in FIG. 3, feeder magazine 100 includes ceiling portion 110, bottom portion 120, a pair of (two) side portions 130 that connect the corresponding side edges of ceiling portion 110 and bottom portion 120, respectively, and back portion 140 that connects the side edges of the pair of side portions 130. Ceiling portion 110, bottom portion 120, and the pair of side portions 130 define opening portion 150 located on a side opposite to back portion 140.

Figure 4:
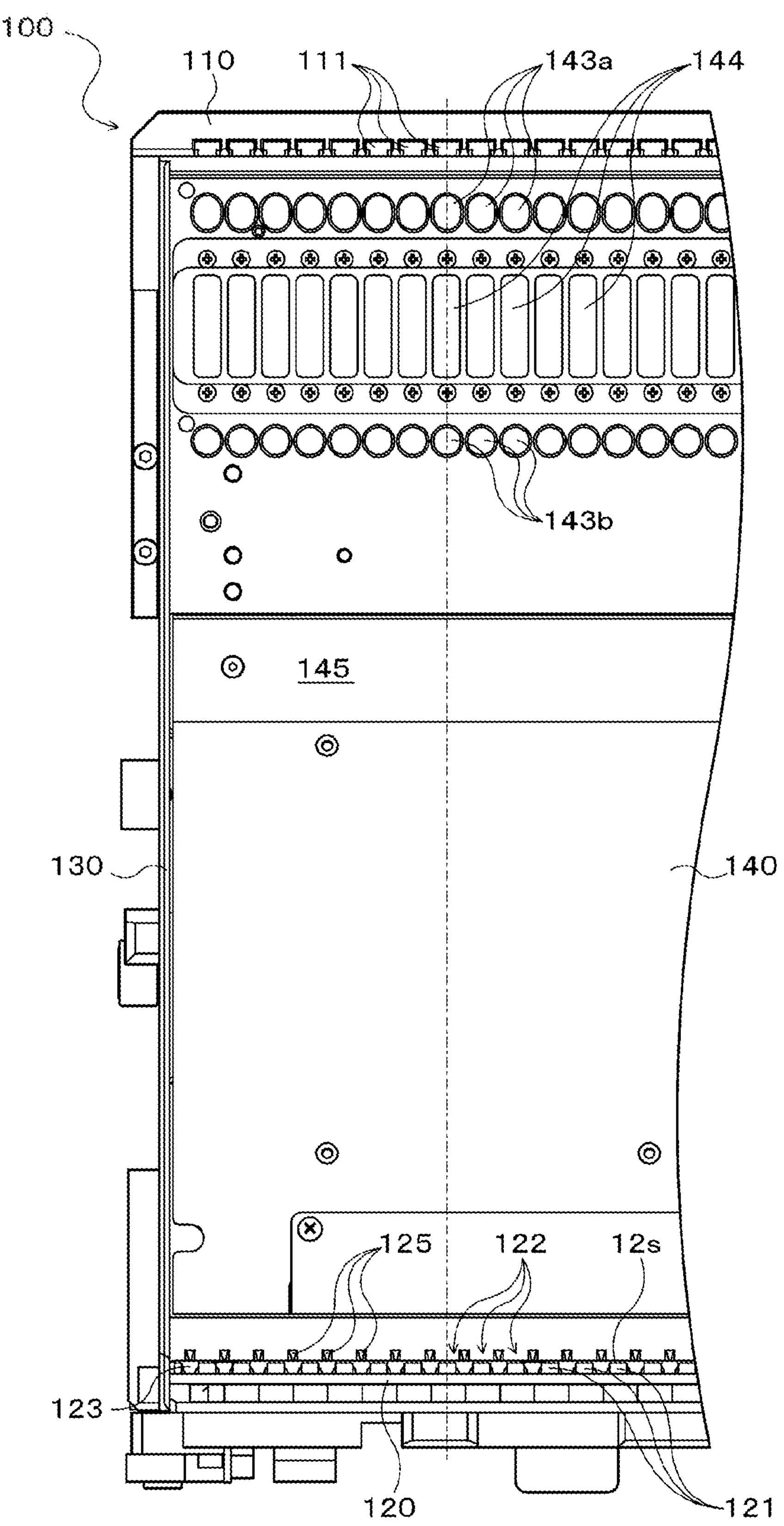
FIG. 4 is an enlarged view of the feeder magazine of the present disclosure viewed from the opening portion side.

As shown in FIG. 3, ceiling portion 110 of feeder magazine 100 is formed so as to cover a predetermined range on opening portion 150 side of bottom portion 120, and an opening portion is formed between ceiling portion 110 and back portion 140. Further, multiple (in the present embodiment, for example, 65) slots 111 (support grooves) into which guide rails 55 (upper end portions) of feeders 50 are detachably inserted are formed in ceiling portion 110, respectively. As shown in FIG. 4, multiple slots 111 have a T-shaped cross section, respectively, open on bottom portion 120 side (lower side), and extend parallel to each other from opening portion 150 toward back portion 140 (see FIG. 3). Accordingly, when guide rail 55 of feeder 50 is inserted into slot 111, feeder 50 is supported in a state of being suspended from ceiling portion 110 via guide rail 55 inserted into slot 111.

As shown in FIG. 3, bottom portion 120 of feeder magazine 100 includes flat surface 12*s* having no unevenness (groove), multiple (in the present embodiment, for example, 65) first positioning portions 121 that can respectively engage with protrusions 57*p* (engaging portions) formed on the lower end portion of feeder 50, and multiple (in the present embodiment, for example, 65) second positioning portions 122 that can respectively engage with front ends 57*t* (second engaging portions) of rail members 57 provided on the lower end portion of feeder 50. Flat surface 12*s* is a smooth flat surface formed on the surface (upper surface) of bottom portion 120 so as to extend parallel to ceiling portion 110 and face multiple slots 111.

As shown in FIG. 3, each of multiple first positioning portions 121 is disposed in bottom portion 120 so as to correspond to each of multiple slots 111 of ceiling portion 110 on opening portion 150 side of flat surface 12*s*. More specifically, each of multiple first positioning portions 121 is a recessed portion recessed from flat surface 12*s* that opens on opening portion 150 side, and faces corresponding slot 111 in the vertical direction when viewed from opening portion 150 side, as shown in FIG. 4. In the present embodiment, multiple first positioning portions 121 are formed at intervals (equal intervals) along the longitudinal direction on a thin edge portion of plate member 123 having a substantially wedge shape in cross section shape that becomes thinner from a first edge portion extending in the longitudinal direction toward a second edge portion. Plate member 123 is fixed to bottom portion 120 so that the surface on thick back portion 140 side is flush with flat surface 12*s*.

As shown in FIG. 3, multiple second positioning portions 122 include multiple protruding pieces 125 formed on narrow plate member 124. In the present embodiment, multiple protruding pieces 125 are formed at intervals (equal intervals) corresponding to the groove width of slot 111 and the width of rail member 57 (front end 57*t*) along the longitudinal direction of plate member 124, and protrude upward from the surface of plate member 124, respectively. Plate member 124 is fixed to bottom portion 120 such that each protruding piece 125 extends parallel to slot 111 of ceiling portion 110 and the surface between adjacent protruding pieces 125 is flush with flat surface 12*s* on back portion 140 side of flat surface 12*s*. When plate member 124 is fixed to bottom portion 120, as shown in FIG. 3, multiple protruding pieces 125 are disposed in bottom portion 120 so as to respectively correspond to multiple slots 111 of ceiling portion 110 on back portion 140 side of flat surface 12*s*. That is, as shown in FIG. 4, a space between two adjacent protruding pieces 125 faces corresponding slot 111 in the vertical direction when viewed from opening portion 150 side, and forms second positioning portion 122 that can engage with front end 57*t* of rail member 57.

As shown in FIGS. 3 and 4, back portion 140 of feeder magazine 100 includes multiple (for example, 65 in the present embodiment) first positioning holes 143*a* into which first positioning pins 53*a* of feeder 50 are inserted, and multiple (for example, 65 in the present embodiment) second positioning holes 143*b* into which second positioning pins 53*b* of feeder 50 are inserted. Multiple first positioning holes 143*a* are formed in back portion 140 at intervals (equal intervals) along the upper edge portion of back portion 140 so as to respectively correspond to multiple slots 111 of ceiling portion 110. Multiple second positioning holes 143*b* are formed in back portion 140 at intervals below first positioning holes 143*a* so as to respectively correspond to multiple slots 111 of ceiling portion 110.

Further, back portion 140 includes multiple (in the present embodiment, for example, 65) connectors 144 that can be respectively coupled to feeder connectors 54 of feeders 50. As shown in FIG. 4, multiple connectors 144 are fixed to back portion 140 so as to face opening portion 150 side between corresponding first positioning holes 143*a* and second positioning holes 143*b* in the vertical direction. Each of multiple connectors 144 is connected to an external connector (not shown) fixed to back portion 140, and the external connector can be coupled to a connector (not shown) provided in storage space 41 of storage section 4. Accordingly, each feeder 50 is connected to the power source of line control device 10 or storage section 4 (not shown) via feeder connector 54, connector 144, the external connector, and the like, and the feeder information of each feeder 50 can be taken into line control device 10.

In addition, as shown in FIGS. 3 and 4, recessed portion 145 for receiving bumper 52*a* of feeder 50 is formed in back portion 140. In the present embodiment, feeder mounting portion 5*f* (see FIG. 1) of each component mounting machine 5 can accommodate multiple feeders 50, and feeder mounting portion 5*f* includes slots, a first positioning portion and a second positioning portion, a first positioning hole and a second positioning hole, a connector, a recessed portion, and the like corresponding ceiling portion 110, bottom portion 120, a pair of side portions 130, slot 111, first positioning portion 121 and second positioning portion 122, first positioning hole 143*a* and second positioning hole 143*b*, connector 144, recessed portion 145, and the like.

Figure 5:
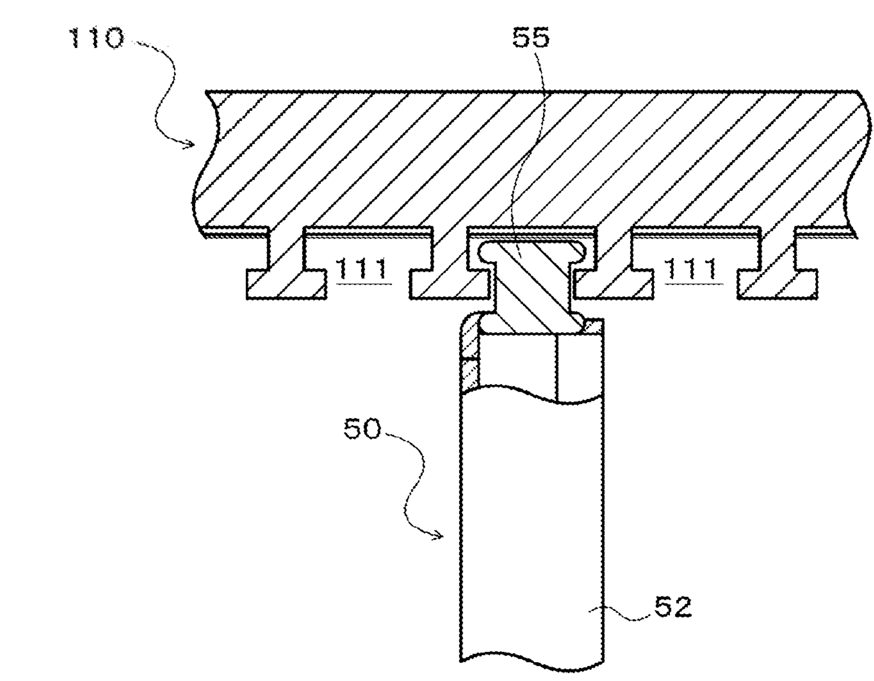
FIG. 5 is an enlarged cross-sectional view illustrating the feeder magazine and the feeder of the present disclosure.
Figure 6:
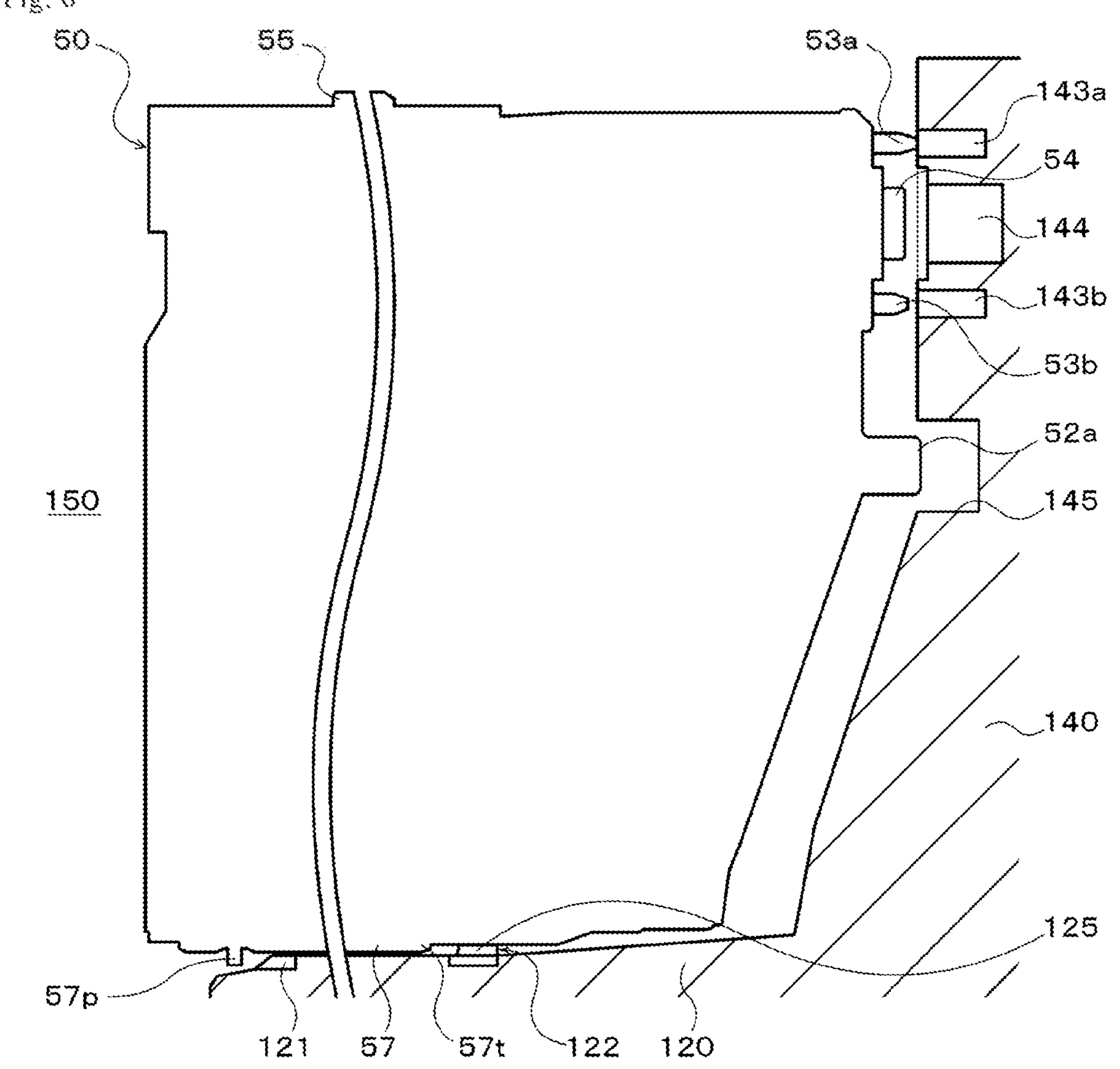
FIG. 6 is a partial cross-sectional view illustrating a process of accommodating the feeder in the feeder magazine of the present disclosure.

When feeder 50 is manually accommodated in feeder magazine 100 by a user (human) configured as described above, first, the front portion of feeder 50 is inserted into feeder magazine 100 via opening portion 150, and as shown in FIG. 5, guide rail 55 (upper end portion) of feeder 50 is inserted into slot 111 which is a target of ceiling portion 110. Further, in a state where guide rail 55 is inserted into slot 111, feeder 50 is pushed toward back portion 140 from opening portion 150. At this time, bumper 52*a* of feeder 50 appropriately pushes away another feeder 50 already accommodated in feeder magazine 100. As shown in FIG. 6, when feeder 50 is pushed toward back portion 140 side, first positioning pin 53*a* of feeder 50 reaches the entrance of first positioning hole 143*a* of back portion 140. When first positioning pin 53*a* is inserted into first positioning hole 143*a* in accordance with the movement of feeder 50 toward back portion 140 side, second positioning pin 53*b* of feeder 50 reaches the entrance of second positioning hole 143*b* of back portion 140.

Figure 7:
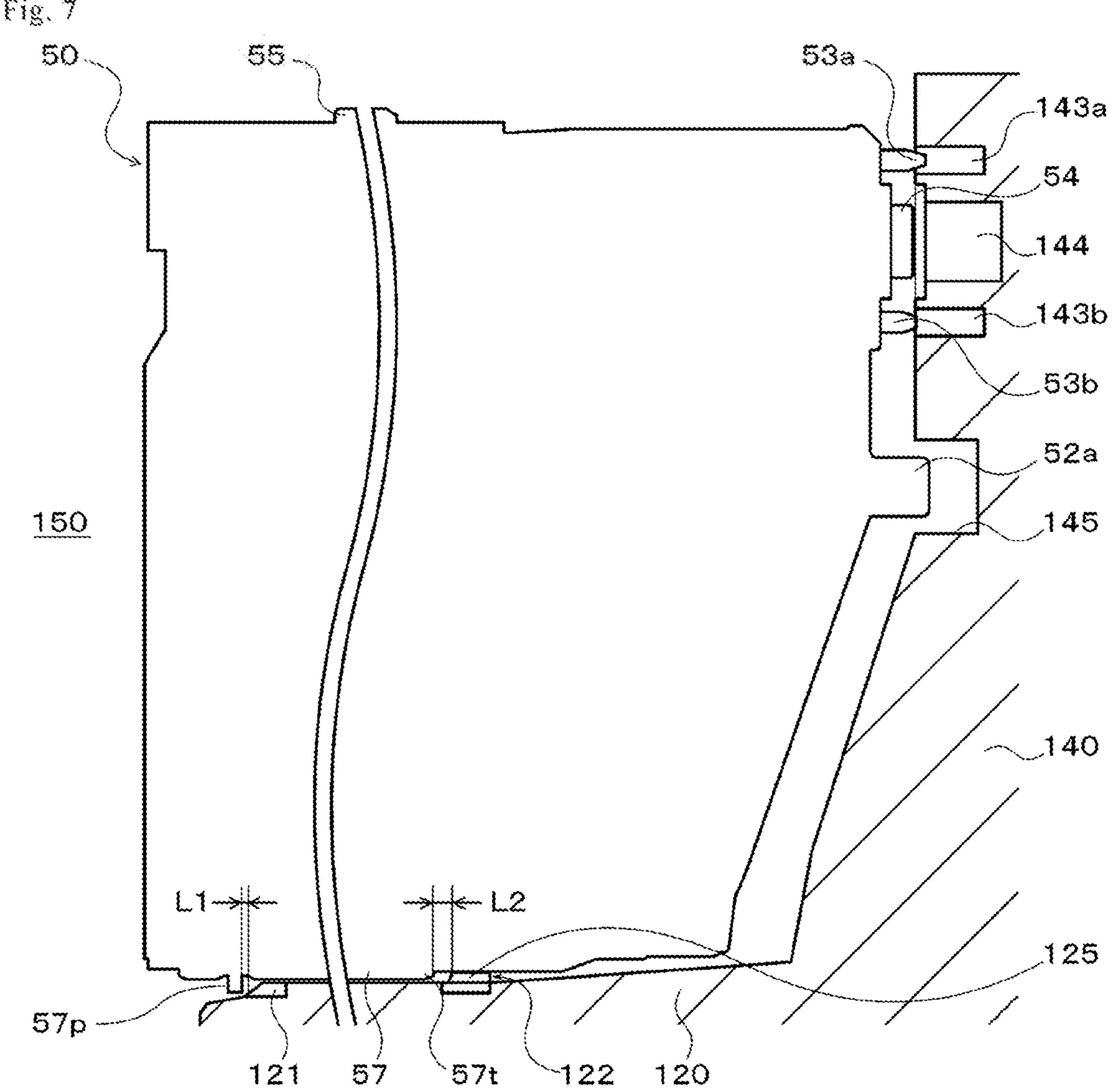
FIG. 7 is a partial cross-sectional view illustrating a process of accommodating the feeder in the feeder magazine of the present disclosure.
Figure 8:
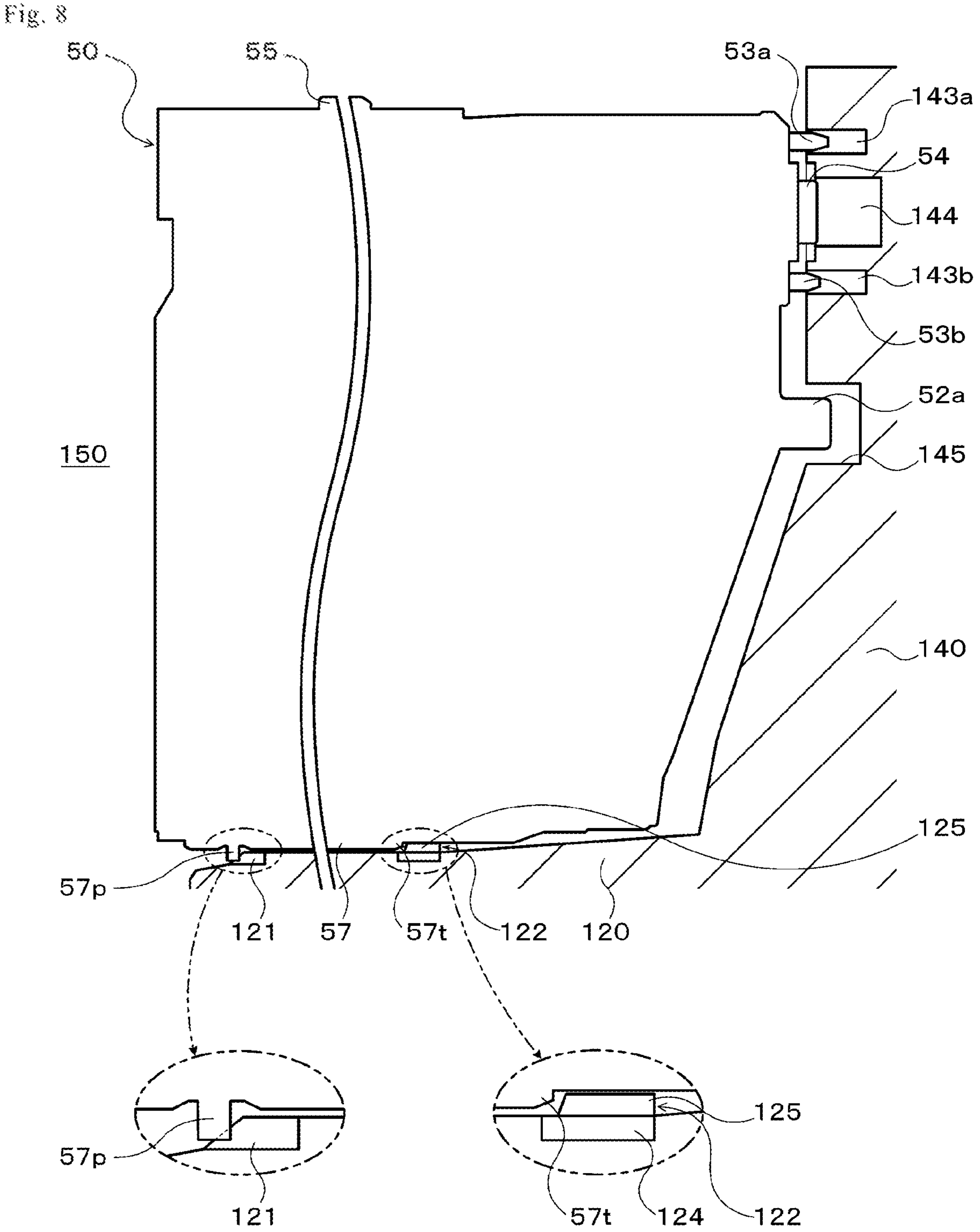
FIG. 8 is a partial cross-sectional view illustrating a process of accommodating the feeder in the feeder magazine of the present disclosure.

Here, as shown in FIG. 7, feeder 50 and feeder magazine 100 of the present embodiment are configured such that, when second positioning pin 53*b* reaches the entrance of second positioning hole 143*b*, distance L1 between protrusion 57*p* (engaging portion) and the engagement start position of first positioning portion 121 is shorter than distance L2 from front end 57*t* (second engaging portion) of rail member 57 to two protruding pieces 125 as first positioning portion 121. Accordingly, when second positioning pin 53*b* is inserted into second positioning hole 143*b* in accordance with the movement of feeder 50, as shown in FIG. 8, protrusion 57*p* of feeder 50 enters first positioning portion 121 (recessed portion) corresponding to slot 111 supporting guide rail 55 and engages with first positioning portion 121.

Figure 9:
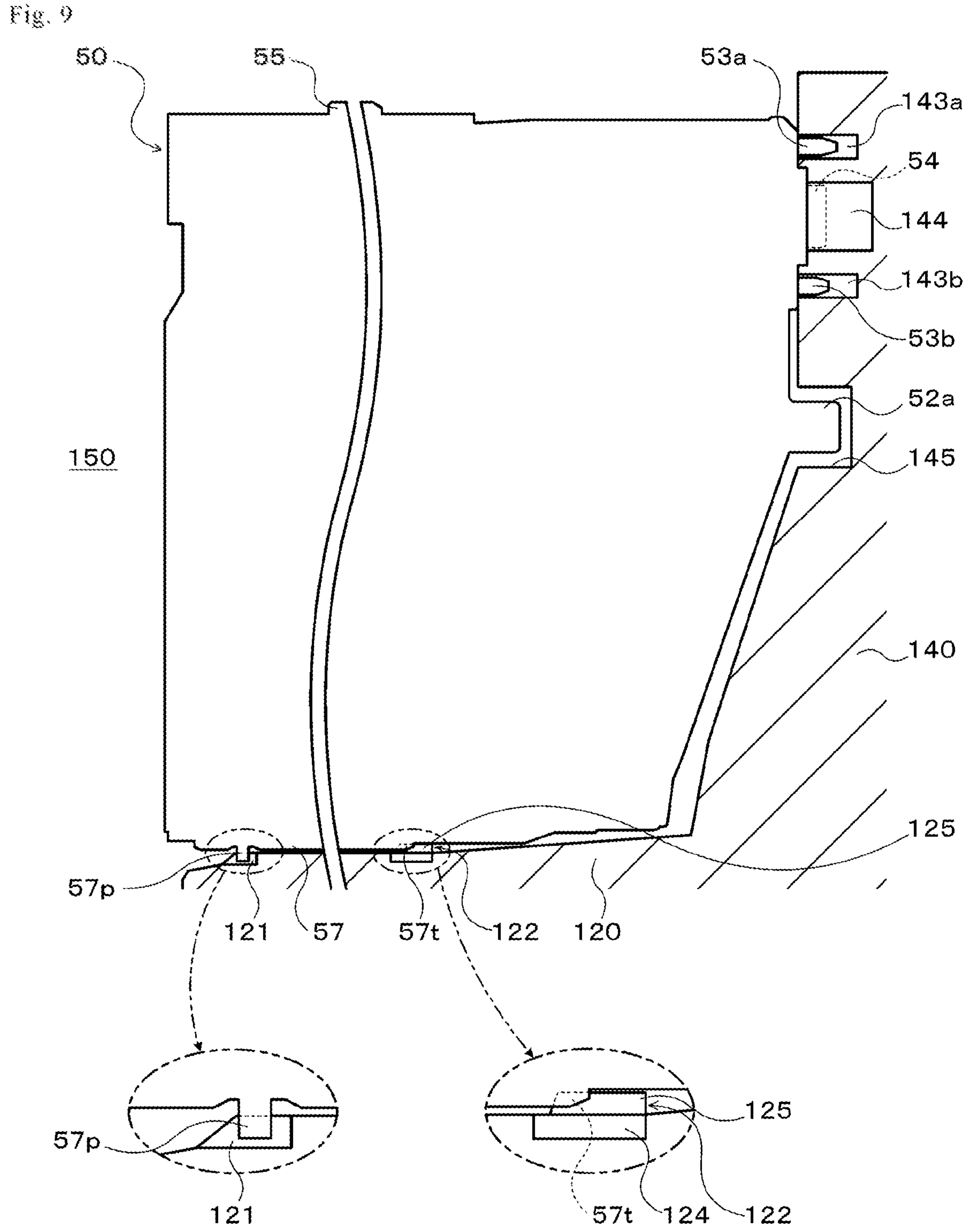
FIG. 9 is a partial cross-sectional view illustrating a state in which the feeder is accommodated in the feeder magazine of the present disclosure.

When feeder 50 is further pushed toward back portion 140 side, as can be seen from FIG. 9, front end 57*t* (second engaging portion) of rail member 57 engages with second positioning portion 122 corresponding to slot 111 supporting guide rail 55. That is, front end 57*t* of rail member 57 is held from both sides by two protruding pieces 125 constituting second positioning portion 122. As shown in FIGS. 8 and 9, feeder connector 54 of feeder 50 is coupled to connector 144 corresponding to slot 111 supporting guide rail 55 in accordance with the movement of feeder 50 toward back portion 140 side. Further, clamp member 56*a* of feeder 50 engages with an engaged portion (not shown) formed in feeder magazine 100. Accordingly, the movement of feeder 50 toward back portion 140 side is restricted, and the accommodation of one feeder 50 into feeder magazine 100 is completed.

As described above, when feeder 50 is accommodated in feeder magazine 100, guide rail 55 forming the upper end portion of feeder 50 is inserted into slot 111 which is a target of ceiling portion 110, and feeder 50 is pushed toward back portion 140 from opening portion 150. Then, as feeder 50 is pushed from opening portion 150 toward back portion 140, protrusion 57*p* (engaging portion) of feeder 50 and front end 57*t* (second engaging portion) of rail member 57 engage with first positioning portion 121 on opening portion 150 side or second positioning portion 122 on back portion 140 side, and the accommodation of feeder 50 into feeder magazine 100 is completed. Accordingly, basically, if feeder 50 is supported by slot 111 of ceiling portion 110 and pushed toward back portion 140, feeder 50 can be accommodated in feeder magazine 100.

In addition, in feeder magazine 100, multiple first positioning portions 121 are disposed on opening portion 150 side of flat surface 12*s*, and multiple second positioning portions 122 are disposed in back portion 140 side of flat surface 12*s*. Accordingly, even if at least one of protrusion 57*p* and front end 57*t* of feeder 50 is engaged with at least one of first positioning portion 121 and second positioning portion 122 not corresponding to slot 111 supporting guide rail 55, protrusion 57*p* and front end 57*t* of feeder 50 can engage with first positioning portion 121 and second positioning portion 122 corresponding to slot 111 supporting guide rail 55 again without removing entire feeder 50 from feeder magazine 100. Accordingly, multiple feeders 50 can be accommodated in feeder magazine 100 so as to extend straight in the vertical direction without being inclined. Further, in feeder magazine 100, since the foreign matter is less likely to stay on flat surface 12*s* of bottom portion 120, it is possible to prevent the foreign matter from being engaged between the lower end portion of feeder 50 and flat surface 12*s*, and thus it is possible to favorably suppress inclination of feeder 50 due to engagement of the foreign matter, interference with other feeders 50, and the like. As a result, according to feeder magazine 100, it is possible to stably accommodate multiple feeders 50 while favorably ensuring the efficiency when accommodating feeders 50.

Further, feeder 50 includes first positioning pin 53*a* that protrudes from upper portion 52*u* of front end surface 52*f*, which is the end surface on back portion 140 side, toward back portion 140, and second positioning pin 53*b* that protrudes from upper portion 52*u* of front end surface 52*f* toward back portion 140 below first positioning pin 53*a*, and in the embodiment described above, the distal end of second positioning pin 53*b* is located closer to opening portion 150 side than the distal end of first positioning pin 53*a*. In addition, in back portion 140, multiple first positioning holes 143*a* into which first positioning pins 53*a* of feeder 50 are respectively inserted and multiple second positioning holes 143*b* into which second positioning pins 53*b* of feeder 50 are respectively inserted are formed so as to respectively correspond to multiple slots 111.

Accordingly, when feeder 50 is pushed toward back portion 140 from opening portion 150, first positioning pin 53*a* is inserted into first positioning hole 143*a* of back portion 140, and then second positioning pin 53*b* is inserted into second positioning hole 143*b*. As a result, feeder 50 supported by slot 111 of ceiling portion 110 is extended straight in the vertical direction by first positioning pin 53*a* and second positioning pin 53*b*, and therefore protrusion 57*p* or front end 57*t* of feeder 50 can be smoothly engaged with the first positioning portion 121 and second positioning portion 122 corresponding to slot 111 supporting guide rail 55.

In the above embodiment, while feeder 50 is pushed from opening portion 150 toward back portion 140, after second positioning pin 53*b* reaches second positioning hole 143*b*, protrusion 57*p* (engaging portion) of feeder 50 engages with first positioning portion 121, and then front end 57*t* (second engaging portion) of rail member 57 of feeder 50 engages with second positioning portion 122. That is, in the above-described embodiment, when protrusion 57*p* of feeder 50 engages with first positioning portion 121 not corresponding to slot 111 supporting guide rail 55, the inclination of feeder 50 prevents front end 57*t* of rail member 57 from smoothly engaging with second positioning portion 122, making it difficult to push feeder 50 toward back portion 140 side. Accordingly, it is possible to make a user accommodating feeder 50 in feeder magazine 100 easily notice that protrusion 57*p* (engaging portion) of feeder 50 is not engaged with first positioning portion 121 with which protrusion 57*p* is supposed to be engaged, and to prompt the user to make a correction.

Further, in the above embodiment, flat surface 12*s* of bottom portion 120 extends parallel to ceiling portion 110. In addition, protrusion 57*p* (engaging portion) of feeder 50 protrudes downward from the lower end surface of rail member 57 (feeder 50), and first positioning portion 121 is a recessed portion recessed from flat surface 12*s* that opens on opening portion 150 side and engages with protrusion 57*p* of feeder 50. Further, two protruding pieces 125 constituting second positioning portion 122 hold front end 57*t* (end portion on back portion 140 side) of rail member 57 of feeder 50 from both sides. Accordingly, when guide rail 55 of feeder 50 is inserted into slot 111 of ceiling portion 110, the lower end portion of feeder 50 (front end 57*t* of rail member 57, and the like) is prevented from interfering with first positioning portion 121, and when protrusion 57*p* is engaged with first positioning portion 121 (recessed portion) not corresponding to slot 111 supporting guide rail 55 of feeder 50, it is possible to remove protrusion 57*p* from first positioning portion 121 and make protrusion 57*p* easily and quickly engage with first positioning portion 121 to which protrusion 57*p* is supposed to engage.

In addition, feeder 50 includes guide rail 55 having a T-shaped cross section fixed to the upper end surface of feeder main body 52, and is supported in a state of being suspended from ceiling portion 110 via guide rail 55 inserted into slot 111. Accordingly, feeder 50 can be extended straight in the vertical direction by the own weight until protrusion 57*p* of feeder 50 and front end 57*t* of rail member 57 pushed toward back portion 140 engage with first positioning portion 121 or second positioning portion 122.

Although feeder magazine 100 of the present disclosure has been described by taking the case where feeder 50 is manually accommodated in feeder magazine 100 as an example, the present disclosure is not limited thereto, and it is needless to say that feeder 50 can be accommodated in feeder magazine 100 by a conveyance device such as loader 9 and the like. In addition, feeder 50 may be configured such that the distal end of first positioning pin 53*a* is located closer to opening portion 150 side than the distal end of second positioning pin 53*b*. Further, for example, when feeder 50 has relatively high rigidity, feeder 50 and feeder magazine 100 may be configured such that protrusion 57*p* (engaging portion) of feeder 50 and front end 57*t* (second engaging portion) of rail member 57 simultaneously engage with first positioning portion 121 or second positioning portion 122. In addition, flat surface 12*s* of bottom portion 120 of feeder magazine 100 is not necessarily a flat surface extending parallel to ceiling portion 110, and may be an inclined surface or a gently curved surface as long as flat surface 12*s* is a surface having no unevenness (slot), may be a flat surface having minute unevenness in which substantially no foreign matter is retained, such as a surface to which a seal or the like is attached or a surface to which wiring or the like is fixed, or a hole may be formed in flat surface 12*s*.

Further, by providing multiple second positioning portions 122 (multiple protruding pieces 125) in feeder magazine 100 or providing elements corresponding to multiple second positioning portions 122 (multiple protruding pieces 125) in feeder mounting portion 5*f* of component mounting machine 5, multiple feeders 50 can be supported by feeder magazine 100 or the like in an extremely stable manner, however, the configuration is not limited to this. That is, multiple second positioning portions 122 (multiple protruding pieces 125) may be omitted from feeder magazine 100, and elements corresponding to multiple second positioning portions 122 (multiple protruding pieces 125) may be omitted from feeder mounting portion 5*f* of component mounting machine 5. In feeder magazine 100 or the like, basically, if feeder 50 is supported by slot 111 of ceiling portion 110 and pushed toward back portion 140, feeder 50 can be accommodated in feeder magazine 100. Further, even if protrusion 57*p* of feeder 50 is engaged with first positioning portion 121 not corresponding to slot 111 supporting guide rail 55, protrusion 57*p* can be engaged again with first positioning portion 121 corresponding to slot 111 supporting guide rail 55 without removing entire feeder 50 from feeder magazine 100. Accordingly, also in this aspect, it is possible to accommodate multiple feeders 50 in feeder magazine 100 or feeder mounting portion 5*f* so as to extend straight in the vertical direction without inclining multiple feeders 50, and it is possible to stably accommodate multiple feeders 50 while favorably ensuring the efficiency when accommodating feeders 50.

The present disclosure is by no means limited to the above embodiment, and it goes without saying that various changes can be made within the scope of the extension of the present disclosure. Further, the above embodiment is merely one specific aspect of the disclosure described in the summary, and does not limit the elements of the disclosure described in the summary.

INDUSTRIAL APPLICABILITY

The present disclosure can be used in the manufacturing industry of an article on which components are mounted.

REFERENCE SIGNS LIST

1 production line, 5 component mounting machine, 5*f* feeder mounting portion, 50 feeder, 51 tape reel, 52 feeder main body, 52*a* bumper, 52*e* electrical component accommodating portion, 52*f* front end surface, 52*r* rear end surface, 52*u* upper portion, 53*a* first positioning pin, 53*b* second positioning pin, 54 feeder connector, 55 guide rail, 56*a* clamp member, 56*b* release lever, 57 rail member, 57*p* protrusion (engaging portion), 57*t* front end (second engaging portion), 100 feeder magazine, 110 ceiling portion, 111 slot, 12*s* flat surface, 120 bottom portion, 121 first positioning portion, 122 second positioning portion, 123, 124 plate member, 125 protruding piece, 130 side portion, 140 back portion, 143*a* first positioning hole, 143*b* second positioning hole, 144 connector, 145 recessed portion, 150 opening portion, P component, S board

The invention claimed is:

1. A feeder magazine comprising:

a ceiling portion;

a bottom portion;

a back portion; and an opening portion on a side opposite to the back portion, the feeder magazine for accommodating multiple feeders each holding multiple components, the feeder magazine comprising:

multiple support grooves that are formed in the ceiling portion so as to open on a bottom portion side and extend in parallel to each other from the opening portion toward the back portion, respectively, and into which upper end portions of the feeders are detachably inserted, respectively;

a flat surface that is formed on the bottom portion so as to face the multiple support grooves of the ceiling portion; and multiple positioning portions that are disposed in the bottom portion so as to respectively correspond to the multiple support grooves on an opening portion side of the flat surface and respectively engage with engaging portions formed on lower end portions of the feeders as the feeders are pushed from the opening portion toward the back portion in a state where the upper end portions are inserted into the support grooves.

2. The feeder magazine according to claim 1, further comprising:

multiple second positioning portions that are disposed in the bottom portion so as to respectively correspond to the multiple support grooves on a back portion side of the flat surface and respectively engage with second engaging portions formed on the lower end portion of the feeders as the feeders are pushed from the opening portion toward the back portion in a state where the upper end portions are inserted into the support grooves.

3. The feeder magazine according to claim 2, wherein the feeder includes a first positioning pin protruding from an upper portion of an end surface on the back portion side toward the back portion and a second positioning pin protruding from the end surface toward the back portion below the first positioning pin, a distal end of a first one of the first positioning pin and the second positioning pin is located closer to the opening portion side than a distal end of a second one of the first positioning pin and the second positioning pin, and multiple first positioning holes into which the first positioning pins of the feeders are respectively inserted and multiple second positioning holes into which the second positioning pins of the feeders are respectively inserted are formed in the back portion so as to respectively correspond to the multiple support grooves.

4. The feeder magazine according to claim 3, wherein while the feeder is pushed from the opening portion toward the back portion, after the second one of the first positioning pin and the second positioning pin reaches the first positioning hole or the second positioning hole, the engaging portion of the feeder engages with the positioning portion, and then the second engaging portion of the feeder engages with the second positioning portion.

5. The feeder magazine according to claim 2, wherein the flat surface extends parallel to the ceiling portion, the engaging portion is a protrusion protruding downward from a lower end surface of the feeder, the second engaging portion is an end portion on the back portion side of a portion forming the lower end surface of the feeder, the positioning portion is a recessed portion recessed from the flat surface that opens on the opening portion side and engages with the protrusion of the feeder, and the second positioning portion holds the second engaging portion of the feeder from both sides.

6. The feeder magazine according to claim 1, wherein the feeder includes a guide rail fixed to an upper end surface and having a T-shaped cross section and is supported in a state of being suspended from the ceiling portion via the guide rail inserted into the support groove.

7. The feeder magazine according to claim 1, wherein the feeder includes a tape reel around which a tape holding the multiple components is wound, and a feeder main body accommodating the tape reel.

8. A component mounting machine comprising:

a feeder mounting portion configured to accommodate multiple feeders each holding multiple components, the component mounting machine for collecting the components from the feeders and mounting the components on an object, wherein the feeder mounting portion includes a ceiling portion, a bottom portion, a back portion, an opening portion on a side opposite to the back portion, multiple support grooves that are formed on the ceiling portion so as to open on a bottom portion side and extend in parallel to each other from the opening portion toward the back portion, respectively, and into which upper end portions of the feeders are detachably inserted, respectively, a flat surface that is formed on the bottom portion so as to face the multiple support grooves of the ceiling portion, and multiple positioning portions that are disposed in the bottom portion so as to respectively correspond to the multiple support grooves on an opening portion side of the flat surface and respectively engage with engaging portions formed on lower end portions of the feeders as the feeders are pushed from the opening portion toward the back portion in a state where the upper end portions are inserted into the support grooves.

* * * * *